United States Patent
Choy et al.

(10) Patent No.: US 6,758,113 B2
(45) Date of Patent: Jul. 6, 2004

(54) HIGH SPEED PICK AND PLACE APPARATUS

(75) Inventors: Ping Kong Choy, Kwai Chung (HK); Chou Kee Liu, Kwai Chung (HK); Wei Hsin Laio, Kwai Chung (HK); Yu Wang, Kwai Chung (HK)

(73) Assignee: ASM Assembly Automation Limited, Kwai Chung (HK)

( * ) Notice: Subject to any disclaimer, the term of this patent is extended or adjusted under 35 U.S.C. 154(b) by 0 days.

(21) Appl. No.: 09/901,084

(22) Filed: Jul. 10, 2001

(65) Prior Publication Data

US 2003/0013322 A1 Jan. 16, 2003

(51) Int. Cl.$^7$ ................................................ B25J 11/00
(52) U.S. Cl. .................... 74/490.01; 901/27; 901/48; 414/719
(58) Field of Search .................. 74/490.01; 901/27, 901/49, 50, 48; 414/722, 719; 248/559; 188/378

(56) References Cited

U.S. PATENT DOCUMENTS

| | | | | |
|---|---|---|---|---|
| 3,586,460 A | * | 6/1971 | Toner | 416/144 |
| 4,182,512 A | * | 1/1980 | Kuebler | 473/521 |
| 4,453,887 A | * | 6/1984 | Schucker | 181/213 |
| 4,671,127 A | * | 6/1987 | Yamaguchi et al. | 74/89.36 |
| 5,016,602 A | * | 5/1991 | Mizek | 124/89 |
| 5,020,644 A | * | 6/1991 | Novoa | 188/268 |
| 5,098,098 A | * | 3/1992 | Petralia | 473/521 |
| 5,102,289 A | * | 4/1992 | Yokoshima et al. | 901/49 |
| 5,155,423 A | * | 10/1992 | Karlen et al. | 901/24 |
| 5,195,930 A | * | 3/1993 | Hirano et al. | 464/113 |
| 5,201,617 A | * | 4/1993 | Delaval et al. | 409/131 |
| 5,454,562 A | * | 10/1995 | Sommer | 473/326 |
| 5,924,261 A | * | 7/1999 | Fricke | 52/167.6 |
| 6,267,022 B1 | * | 7/2001 | Suzuki | 74/490.01 |

FOREIGN PATENT DOCUMENTS

EP         0 310 203 A1 * 2/1987 ............ D02G/3/40

* cited by examiner

*Primary Examiner*—David A. Bucci
*Assistant Examiner*—Bradley J. Van Pelt
(74) *Attorney, Agent, or Firm*—Burns, Doane, Swecker & Mathis, L.L.P.

(57) ABSTRACT

A pick and place apparatus comprises a bond arm adapted for rotation about an axis between a pick location and a place location. The bond arm is formed with a cavity at an end of the arm remote from the axis, within which cavity are located a plurality of damping particles for damping unwanted vibrations of the bond arm. The particles may be irregular tungsten granules with a diameter between 0.3 and 1.2 mm and a filling ratio of about 75%.

8 Claims, 2 Drawing Sheets

HIGH SPEED PICK AND PLACE APPARATUS

FIELD OF THE INVENTION

This invention relates to a pick and place apparatus, in particular to such an apparatus for use in a die attachment operation in semiconductor manufacturing processes, and more particularly still is directed to such an apparatus that is capable of operating at high speed and with high precision.

BACKGROUND OF THE INVENTION

Pick and place apparatus are used in a number of operations within semiconductor manufacturing and assembly processes. As the name implies, a pick and place apparatus functions to pick a component from one location, and then place it in a second location.

One example of such apparatus is used in a die attachment operation. In such an operation a pick and place apparatus is used to pick a die from a delivery mechanism, and then transfer the die to a desired location on, for example, a printed circuit board and place the die on the board. The apparatus may also carry out a bonding operation.

It will be appreciated that the speed of the die attachment operation is dependent on the speed with which the pick and place apparatus can function to accurately pick a die and place it in the desired location on the circuit board. Unfortunately with ever smaller dies and ever more accurate placement being necessary, problems arise as a consequence of the competing needs for speed and accuracy.

PRIOR ART

FIG. 1 is a perspective view of a pick and place apparatus according to the prior art. The apparatus comprises a bond arm 1 that is adapted to move both vertically (ie in the Z axis) and rotationally about the Z axis through an angle θ. Both the vertical and rotational movement is effected by means of a motorized actuator unit 3 which enables the bond arm 1 to rotate through 90° about the Z axis.

The bond arm comprises two main parts that are interconnected by a pivot joint 2 such that the main part of the bond arm 1 can swing about the Y axis with respect to the rear part 5 of the bond arm. This enables a pick tool 4 to be movable vertically with an adjustable bonding force that is set by a pre-loaded spring 7.

With such apparatus the pick operation in which a die is picked from some form of delivery system, and the subsequent placement and bonding operations, are all performed using vertical movement in the Z direction, either by movement of the whole bond arm by the actuator 3, or by swinging movement of the bond arm 1 about pivot 2. However, between the pick operation and the placement and bonding operations, a transfer operation is carried out that involves rotary movement about the Z axis. In this operation a die is transferred from the pick location to the placement location.

A difficulty arises, however, with high speed operation. If the bond arm is rotated about the Z-axis at high speed, it must be stopped rapidly at the ends of its travel. This sudden stopping of the bond arm causes substantial vibrations in the bond arm that result in a placement error. This is particularly problematic when the bond arm has been moved to transfer a die from the pick location to the place location where a very high degree of accuracy is required. In practice, the placement and subsequent bonding operations cannot be performed until the vibration of the bonding arm caused by the sudden stopping of the rotary movement has died away.

In other words, any gains in operational speed from high speed rotary movement of the pick and place apparatus are, at least to a degree, lost by the fact that the consequential vibrations must be allowed to die away before the placement and bonding operations can be performed.

SUMMARY OF THE INVENTION

According to the present invention there is provided a pick and place apparatus comprising a pick and place member adapted to pick an electronic component from a first location and to place said component at a second location, wherein said pick and place member is formed with a cavity within which cavity are located a plurality of damping particles for damping unwanted vibrations of the pick and place member.

Preferably the particles are irregular in shape, for example they may be tungsten granules, with a diameter in the range of between 0.3 and 1.2 mm. The particles may fill the cavity with a filling ratio of about 75% by volume.

In a particularly preferred embodiment the pick and place member may be a bond arm that is adapted for rotation about an axis, and the cavity is formed at an end of the bond arm remote from the axis.

BRIEF DESCRIPTION OF THE DRAWINGS

An embodiment of the invention will now be described by way of example and with reference to the accompanying drawings, in which.

DETAILED DESCRIPTION OF PREFERRED EMBODIMENT

Figure 1:
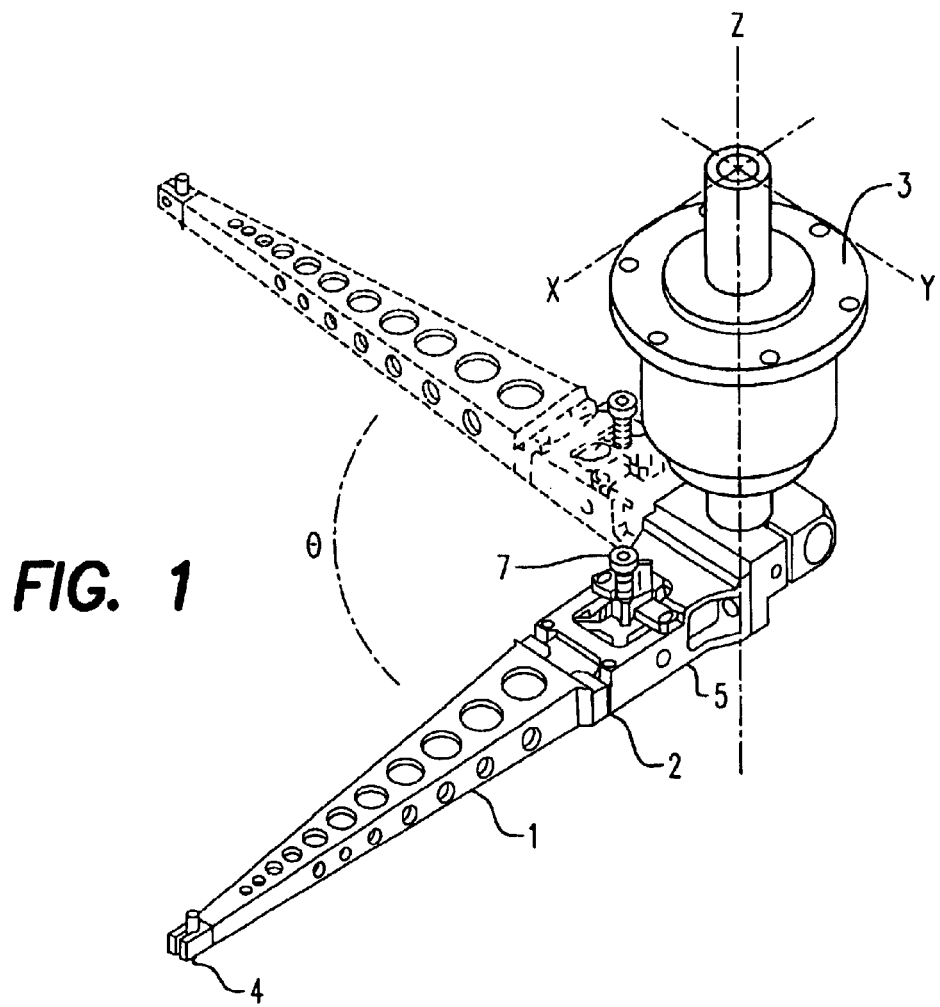
FIG. 1 is a perspective view of a pick and place apparatus.

As described above, FIG. 1 shows a basic type of pick and place apparatus, and to which the present invention may be applied. In particular the apparatus comprises a pick and place member in the form of a bond arm 1 adapted for rotation about a Z-axis, and additionally vertical movement along said Z-axis. The bond arm may be divided by pivot joint 2 to provide a rear bond arm portion 5. The main part of the bond arm 1 can swing about pivot joint 5 so that a pick tool can move in the Z-direction. Pick, placement and bonding operations involve movement in the Z-direction, either using the actuator 3 or by pivoting movement of the main part of the bond arm 1 about pivot joint 5. Transfer of dies, however, from a pick location to the desired place location, involves a rotary movement about the Z-axis through an angle θ.

Figure 2:
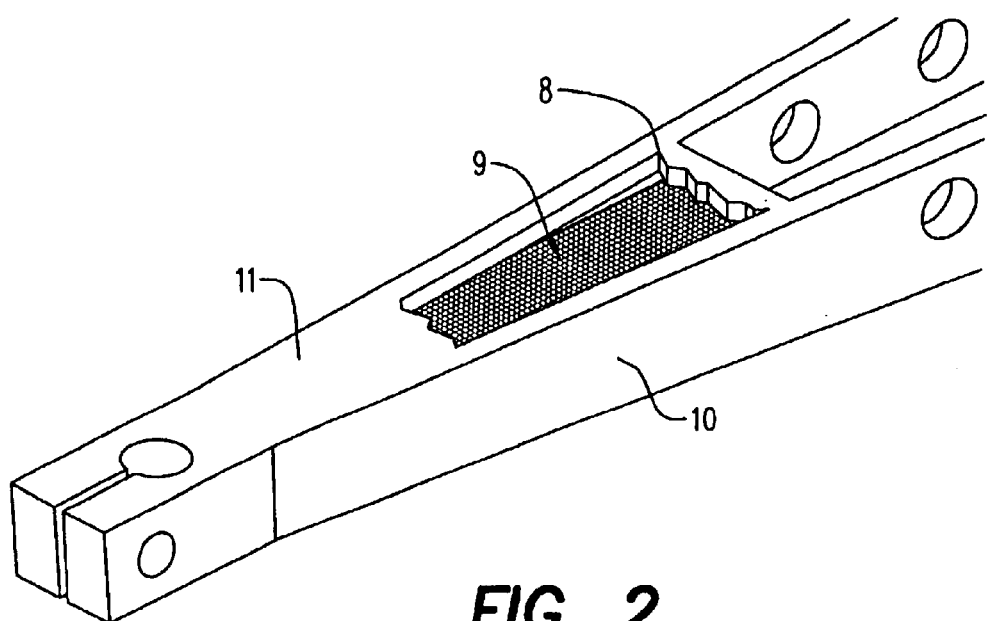
FIG. 2 is a detail of the end of the bonding arm in an embodiment of the present invention.

FIG. 2 shows in detail a portion of the end of the bond arm 1 distal from the actuator 3, and therefore at the most remote point from the Z-axis. As can be seen from both FIGS. 1 and 2, the bond arm is primarily constructed so as to be hollow, and with openings formed in the side walls of the bond arm. This construction is used to ensure that the bond arm is both light and strong. As shown in FIG. 2, however, at the end of the bond arm a transverse wall 8 is formed across the bond arm, and the side walls are formed without openings. In FIG. 2 the opening in the top of the distal portion of the bond arm is shown only for the purposes of illustration and will not exist.

Figure 3:
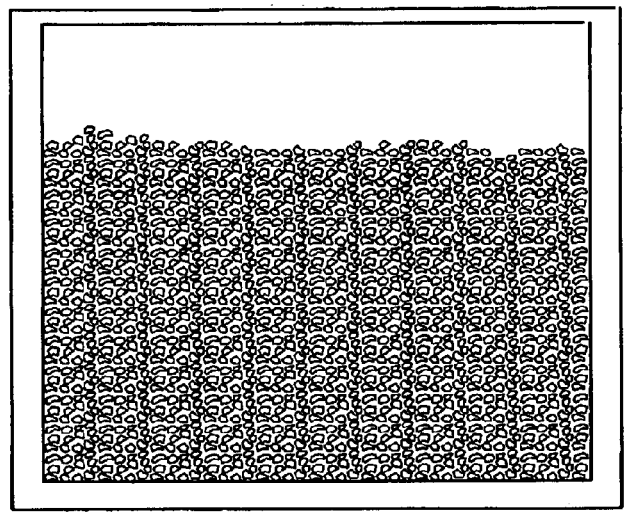
FIG. 3 is a view of the type of particles that may be used in embodiments of the present invention.

Thus transverse wall 8 and side walls 10, and top and bottom walls 11 (bottom wall not visible in the Figures) define a cavity. Within this cavity are located a plurality of damping particles 9 that occupy the cavity space to a filling ratio of about 75–95% by volume. The filling ratio may be chosen depending on the speed of movement of the bond arm, higher speeds would require lower filling ratios so as to ensure that sufficient movement of the particles is possible to effectively damp the vibrations. Damping particles 9 are irregular in shape and may comprise tungsten granules, though other materials may also be used such as lead particles of similar size and shape. The diameter of the particles may be in the range of 0.3 to 1.2 mm, and it should be noted here that as the particles may not be spherical, the term "diameter" is used to denote simply the maximum dimension of a particle. FIG. 3 illustrates typical particles packed in a non-obstructive form within the cavity.

Figure 4:
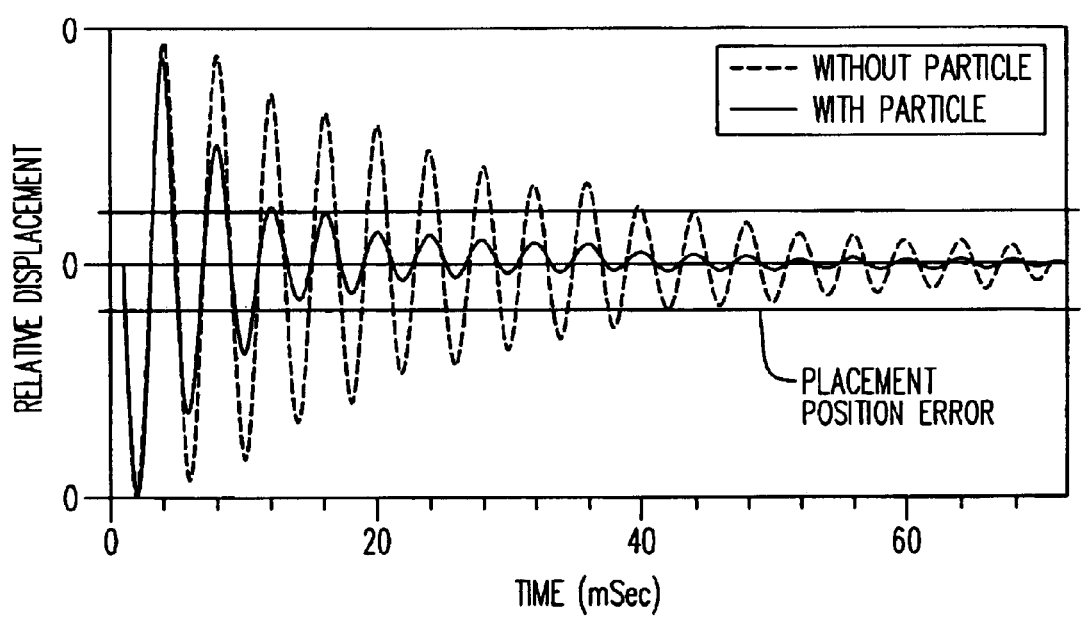
FIG. 4 is a plot showing the improvement in vibration damping provided by the present invention at least in preferred forms.

FIG. 4 illustrates the beneficial effect of the present invention, at least in a preferred embodiment, by comparing the vibration decay of the bond arm of a conventional pick and place apparatus (shown in broken line), with the vibration decay of the bond arm of a pick and place apparatus according to an embodiment of the invention including a cavity at the end of the bond arm that is filled with damping particles as described above. From FIG. 4 it can be seen that the vibration decays to an acceptable placement error substantially faster using the embodiment of the present invention. This is believed to be because vibration energy is absorbed by collisions between the particles and the walls of the bond arm, and by collisions between particles. This vibration energy is converted to heat. The particles are preferably granular to increase the friction between them, and the volume filling ratio is selected so as to allow enough space for the particles to move and collide with each other (and with the walls of the cavity) while providing plenty of damping particles to absorb the kinetic energy of the vibrations.

The above described embodiment of the invention relates to a pick and place apparatus in which the bond arm is caused to move in a rotary sense, and the above discussion is in terms of damping vibrations following rapid rotary movement. But it will also be understood that in the embodiment described above the bond arm also moves linearly (in the Z direction) and the present invention is equally effective in damping vibrations following such linear movement. Indeed in general the present invention may also be applied to a pick and place apparatus where the bond arm moves in a linear direction. It will also be understood that while in the embodiment described above it is a bond arm that is being damped, this is not essential and the invention may be used to damp vibrations of any pick and place member whether or not that member serves as a bond arm.

What is claimed is:

1. A pick and place apparatus for a semiconductor die attachment operation, comprising a pick and place member adapted to pick a die from a first location and to place said die at a second location, wherein said pick and place member is formed with a cavity within which cavity are located a plurality of granular damping particles for damping unwanted vibrations of the pick and place member.

2. Apparatus as claimed in claim 1 wherein said particles are non-spherical in shape.

3. Apparatus as claimed in claim 1 wherein said particles are tungsten granules.

4. Apparatus as claimed in claim 1 wherein said particles have a diameter between 0.3 and 1.2 mm.

5. Apparatus as claimed in claim 1 wherein said particles occupy said cavity with a filling ratio of between about 75–95% by volume.

6. Apparatus as claimed in claim 1 wherein said pick and place member is a bond arm.

7. Apparatus as claimed in claim 6 wherein said bond arm is adapted for rotation about an axis, and wherein said cavity is formed at an end of said bond arm remote said axis.

8. A pick and place apparatus for a semiconductor die attachment operation, comprising a bond arm adapted for rotation about an axis between a pick location and a place location, wherein said bond arm is formed with a cavity in an end of said arm remote from said axis, and within which cavity are located a plurality of granular damping particles for damping unwanted vibrations of the bond arm.

* * * * *

UNITED STATES PATENT AND TRADEMARK OFFICE
CERTIFICATE OF CORRECTION

PATENT NO. : 6,758,113 B2
DATED : July 6, 2004
INVENTOR(S) : Ping Kong Choy et al.

It is certified that error appears in the above-identified patent and that said Letters Patent is hereby corrected as shown below:

<u>Title page,</u>
Item [75], Inventors, change "Laio" to -- Liao --.

Signed and Sealed this

Twenty-seventh Day of September, 2005

JON W. DUDAS
*Director of the United States Patent and Trademark Office*